US008362827B2

(12) United States Patent
Takahashi et al.

(10) Patent No.: US 8,362,827 B2
(45) Date of Patent: Jan. 29, 2013

(54) SEMICONDUCTOR DEVICE INCLUDING TRANSISTORS THAT EXERCISE CONTROL TO REDUCE STANDBY CURRENT

(75) Inventors: Kenji Takahashi, Tokyo (JP); Kiyohiro Furutani, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 12/656,011

(22) Filed: Jan. 13, 2010

(65) Prior Publication Data
US 2010/0181839 A1  Jul. 22, 2010

(30) Foreign Application Priority Data
Jan. 22, 2009 (JP) ................................. 2009-011642

(51) Int. Cl.
G05F 1/10 (2006.01)

(52) U.S. Cl. .......................................... 327/544; 326/33

(58) Field of Classification Search .................. 327/544; 326/33
See application file for complete search history.

(56) References Cited

U.S. PATENT DOCUMENTS

| 5,204,554 | A  | * | 4/1993  | Ohannes et al. | 326/33  |
|-----------|----|---|---------|----------------|---------|
| 5,973,552 | A  | * | 10/1999 | Allan          | 327/544 |
| 6,034,563 | A  | * | 3/2000  | Mashiko        | 327/544 |
| 6,049,245 | A  | * | 4/2000  | Son et al.     | 327/544 |
| 6,215,159 | B1 | * | 4/2001  | Fujita et al.  | 257/369 |
| 6,291,869 | B1 | * | 9/2001  | Ooishi         | 257/500 |
| 6,292,015 | B1 | * | 9/2001  | Ooishi et al.  | 326/33  |
| 6,329,874 | B1 | * | 12/2001 | Ye et al.      | 327/544 |
| 6,559,708 | B2 | * | 5/2003  | Notani         | 327/537 |
| 6,816,418 | B2 | * | 11/2004 | Hidaka         | 365/189.09 |
| 6,838,927 | B2 | * | 1/2005  | Oonishi        | 327/534 |
| 7,042,245 | B2 | * | 5/2006  | Hidaka         | 326/34  |
| 7,053,692 | B2 | * | 5/2006  | Parris et al.  | 327/427 |
| 7,102,254 | B2 | * | 9/2006  | Veendrick et al. | 307/126 |
| 7,180,363 | B2 | * | 2/2007  | Parris et al.  | 327/544 |
| 7,248,522 | B2 | * | 7/2007  | Hardee         | 365/205 |
| 7,274,217 | B2 | * | 9/2007  | Chuang et al.  | 326/83  |
| 7,292,495 | B1 | * | 11/2007 | Kenkare et al. | 365/226 |
| 7,372,765 | B2 | * | 5/2008  | Hardee         | 365/230.06 |
| 7,376,847 | B2 | * | 5/2008  | Chen et al.    | 713/300 |
| 7,418,612 | B2 | * | 8/2008  | Do             | 713/323 |
| 7,532,036 | B2 | * | 5/2009  | Fujikawa et al. | 326/98 |
| 7,649,405 | B2 | * | 1/2010  | Wang et al.    | 327/544 |
| 7,675,347 | B2 | * | 3/2010  | Teramoto et al. | 327/534 |
| 7,851,948 | B2 | * | 12/2010 | Kawasaki       | 307/130 |
| 7,908,499 | B2 | * | 3/2011  | Ito            | 713/320 |

(Continued)

FOREIGN PATENT DOCUMENTS

JP  11-31385  2/1999

*Primary Examiner* — Thomas J Hiltunen
(74) *Attorney, Agent, or Firm* — McGinn IP Law Group, PLLC

(57) ABSTRACT

A semiconductor device includes two functional circuits, PMOS transistors and NMOS transistors. The PMOS transistors control whether or not a power supply potential is to be delivered to functional circuits, and the NMOS transistors control whether or not a power supply potential GND is to be delivered to the functional circuits. An external terminal supplied with a third power supply potential and another external terminal is supplied with a fourth power supply potential higher than the third power supply potential. A power supply control circuit delivers a control signal, having the fourth power supply potential as amplitude, to transistors to control the electrically conducting state or the electrically non-conducting state of transistors. The power supply control circuit also delivers a control signal, having the third power supply potential as amplitude, to transistors to control the electrically conducting or non-conducting state of the NMOS transistors.

17 Claims, 7 Drawing Sheets

U.S. PATENT DOCUMENTS

| | | | |
|---|---|---|---|
| 7,936,205 B2 * | 5/2011 | Kong et al. | 327/534 |
| 7,995,418 B2 * | 8/2011 | Joshi et al. | 365/227 |
| 8,059,482 B2 * | 11/2011 | Russell et al. | 365/226 |
| 2004/0080340 A1 * | 4/2004 | Hidaka | 326/83 |
| 2005/0052936 A1 * | 3/2005 | Hardee | 365/230.06 |
| 2005/0091066 A1 * | 4/2005 | Singhal | 704/500 |
| 2007/0063763 A1 * | 3/2007 | Yoo et al. | 327/544 |
| 2007/0176673 A1 * | 8/2007 | Ito | 327/544 |
| 2009/0046523 A1 * | 2/2009 | Maki | 365/200 |

* cited by examiner

SEMICONDUCTOR DEVICE INCLUDING TRANSISTORS THAT EXERCISE CONTROL TO REDUCE STANDBY CURRENT

FIELD OF THE INVENTION

Reference to Related Application

This application is based upon and claims the benefit of the priority of Japanese patent application No. 2009-011642, filed on Jan. 22, 2009, the disclosure of which is incorporated herein in its entirety by reference thereto.

This invention relates to a semiconductor device and, more particularly, to a semiconductor device capable of reducing the standby current.

BACKGROUND

Semiconductor integrated circuits of late use miniaturized transistors of low power consumption. To assure operational reliability of these transistors, the power supply voltages used are becoming lower and, to assure a high operating speed of the semiconductor integrated circuit of the low power supply voltage, transistors of low threshold voltages are used in peripheral circuitry. However, if the transistor threshold voltage is lowered, the gate-to-source voltage of the transistor approaches to 0V to increase the current that flows under the transistor off state (off leak current) and hence the standby current of the semiconductor integrated circuit. There has thus been known a technique in which the source potential of a transistor, turned off at the standby time, is connected to a power supply that is turned off at the standby time, thereby reducing the standby current (Patent Document 1).

[Patent Document]
[Patent Document 1]
 JP Patent Kokai JP-H11-31385A

SUMMARY

The following analysis is made from the view of the present invention.

Recently, the demand for enhancing the circuit size (integration degree) of the semiconductor integrated circuit and for reducing the power consumption is increasing. With the conventional technique, current consumption at the standby time may be reduced by a certain amount. It is however difficult to cope with the demand for further reducing the current consumption. Thus there is much desired in the art.

In one aspect or mode of the present invention, there is provided a semiconductor device comprising a functional circuit, a first transistor, a second transistor, a first external terminal, a second external terminal, and a power supply control circuit. The first transistor exercises control as to whether or not a first power supply potential is to be delivered to the functional circuit. The second transistor exercises control as to whether or not a second power supply potential is to be delivered to the functional circuit. The first external terminal is supplied with a third power supply potential, and the second external terminal is supplied with a fourth power supply potential higher than the third power supply potential. The power supply control circuit delivers a first control signal, having the fourth power supply potential as an amplitude, to the first transistor to control its electrically conducting state or electrically non-conducting state. The power supply control circuit also delivers a second control signal, having the third power supply potential as an amplitude, to the second transistor to control its electrically conducting state or electrically non-conducting state. The functional circuit is in operation or in a standby state in case the first and second transistors are in the electrically conducting state or in the electrically non-conducting state, respectively.

In a second aspect of the present invention, there is provided A semiconductor device comprising: a circuit; first and second voltage terminals supplied respectively with first and second voltages; a first transistor provided between the first voltage terminal and the circuit to control a supplied of the first voltage to the circuit in response to a first control signal; and a second transistor provided between the second voltage terminal and the circuit to control a supplied of the second voltage to the circuit in response to a second control signal, and the second control signal is different in voltage amplitude from the first signal.

According to the present invention, the first transistor is controlled by a signal that has a fourth power supply potential of a high potential level as an amplitude. It is thus possible to further decrease current consumption at the standby time.

PREFERRED MODES

Figure 1:
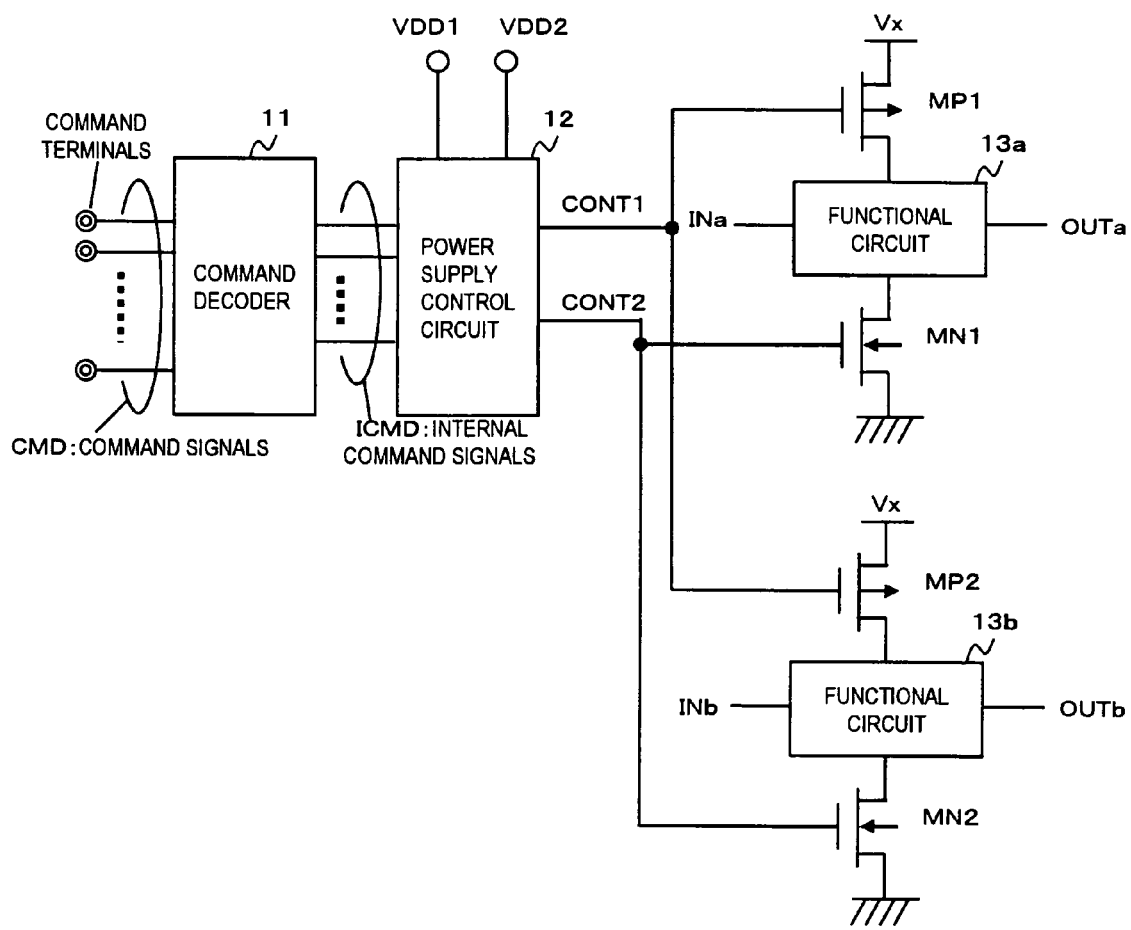
FIG. 1 is a block diagram showing the configuration of a semiconductor device related with Example 1 of the present invention.

A semiconductor device according to an exemplary embodiment of the present invention includes two functional circuits (13a, 13b of FIG. 1), two first transistors (MP1, MP2 of FIG. 1), two second transistors (MN1, MN2 of FIG. 1), a first external terminal (VDD2 of FIG. 1), a second external terminal (VDD1 of FIG. 1) and a power supply control circuit (12 of FIG. 1). The first transistors exercise control as to whether or not a first power supply potential (Vx of FIG. 1) is to be delivered to the functional circuits. The second transistors exercise control as to whether or not a second power supply potential (GND of FIG. 1) is to be delivered to the functional circuits. The first external terminal is supplied with a third power supply potential, and the second external terminal is supplied with a fourth power supply potential higher than the third power supply potential. The power supply control circuit delivers a first control signal (CONT1 of FIG. 1), having the fourth power supply potential as an amplitude, to the first transistors to control the electrically conducting state or the electrically non-conducting state of the first transistors. The power supply control circuit also delivers a second control signal (CONT2 of FIG. 1), having the third power supply potential as an amplitude, to the second transistors to control the electrically conducting state or the electrically non-conducting state of the second transistors. The functional circuits are in operation or in standby states in case the first and second transistors are in the electrically conducting state or in the electrically non-conducting state, respectively.

The power supply control circuit preferably may control the electrically conducting state or the electrically non-conducting state of the first and second transistors based on a command signal (CMD of FIG. 1) entered from outside.

The first transistors may be PMOS transistors, and the second transistors may be NMOS transistors. The first and second control signals may be supplied in reverse logic levels relative to each other.

The first and second transistors may be NMOS transistors. The first and second control signals may be supplied in the same logic level.

The semiconductor device may also include third and fourth transistors (MP31 and MP32 of FIG. 6) that exercise control as to whether or not the third power supply potential is to be supplied as the first power supply potential. The semiconductor device may further include a power down control circuit (21 of FIG. 6) that delivers a third control signal, having an amplitude between the fourth power supply potential and a negative potential (VKK of FIG. 6), to the third transistor to control an electrically conducting state or an electrically non-conducting state of the third transistor. The power down control circuit also delivers a fourth control signal, having the fourth power supply potential as an amplitude, to the fourth transistor to control an electrically conducting state or an electrically non-conducting state of the fourth transistor. The semiconductor device may further include a negative potential generation circuit (22 of FIG. 6) that generates the negative potential based on the first power supply potential to deliver the negative potential generated to the power down control circuit.

The fourth transistor may be controlled to deliver the third power supply potential to only the negative potential generation circuit. The negative potential generation circuit may operate by the first power supply potential delivered by the fourth transistor.

The power down control circuit may control the electrically conducting state or the electrically non-conducting state of the third and fourth transistors based on a command signal entered from outside.

With the above mentioned semiconductor device, in which the first transistors are controlled by the signal having the fourth power supply potential of a high potential level as an amplitude, the current that flows in the off-state of the first transistor (off-leakage current) may be reduced to a smaller value. It is thus possible to reduce current consumption at the standby time.

In the semiconductor device according to the second aspect the first transistor may comprise a P-type transistor, the second transistor may comprise an N-type transistor, and the first control signal may be larger in voltage amplitude than the second control signal.

An Example of the present invention is now described in detail with reference to the drawings.

EXAMPLE 1

FIG. 1 depicts a block diagram showing a configuration of a semiconductor device according to Example 1 of the present invention. Referring to FIG. 1, the semiconductor device includes a command decoder 11, a power supply control circuit 12, functional circuits 13a, 13b, NMOS transistors MN1, MN2, PMOS transistors MP1, MP2 and external terminals VDD1, VDD2. It is noted that the semiconductor device, described in the present Example, is a DRAM, by way of an example only in a non-restrictive meaning.

The command decoder 11 receives a set of command signals CMD from outside, and generates a set of internal command signals ICMD that allow performing the operations corresponding to the command signals, supplied from outside, within the DRAM. As in a routine DRAM, the command signals may be enumerated by, for example, a chip select signal /CS, a row address strobe signal /RAS, a column address strobe signal /CAS and a write enable signal /WE. The internal command signals ICMD may be enumerated by, for example, an ACT signal that activates a row address and a REF signal that initiates a refresh operation.

The power supply control circuit 12 inputs the internal command signals ICMD and the supply powers from the external terminals VDD1, VDD2, and outputs control signals CONT1, CONT2 used to control whether or not an internal voltage Vx and GND are to be supplied to the functional circuits 13a, 13b. For example, VDD1 and VDD2 are set so that VDD1=1.8V and VDD2=1.2V. It should be noted that the same symbols VDD1 and VDD2 are used to denote not only the external terminals but also the corresponding power supplies and the corresponding voltages.

As regards the power supply on the positive side, the functional circuit 13a receives the internal voltage Vx via the PMOS transistor MP1. As regards the power supply on the GND side, the functional circuit 13a is grounded via the NMOS transistor MN1. The control signal CONT1 is supplied to the gate of the PMOS transistor MP1, while the control signal CONT2 is supplied to the gate of the NMOS transistor MN1. When the PMOS transistor MP1 and the NMOS transistor MN1 are rendered conductive (turned on) by the control signals CONT1, CONT2, respectively, the functional circuit 13a is in operation and delivers an output signal OUTa corresponding to an input signal INa. When the PMOS transistor MP1 and the NMOS transistor MN1 are rendered non-conductive (turned off) by the control signals CONT1, CONT2, respectively, the functional circuit 13a is in a stand-by state and is not in operation. It is noted that the configuration and the operation of the functional circuit 13b are similar to those of the functional circuit 13a.

Figure 2:
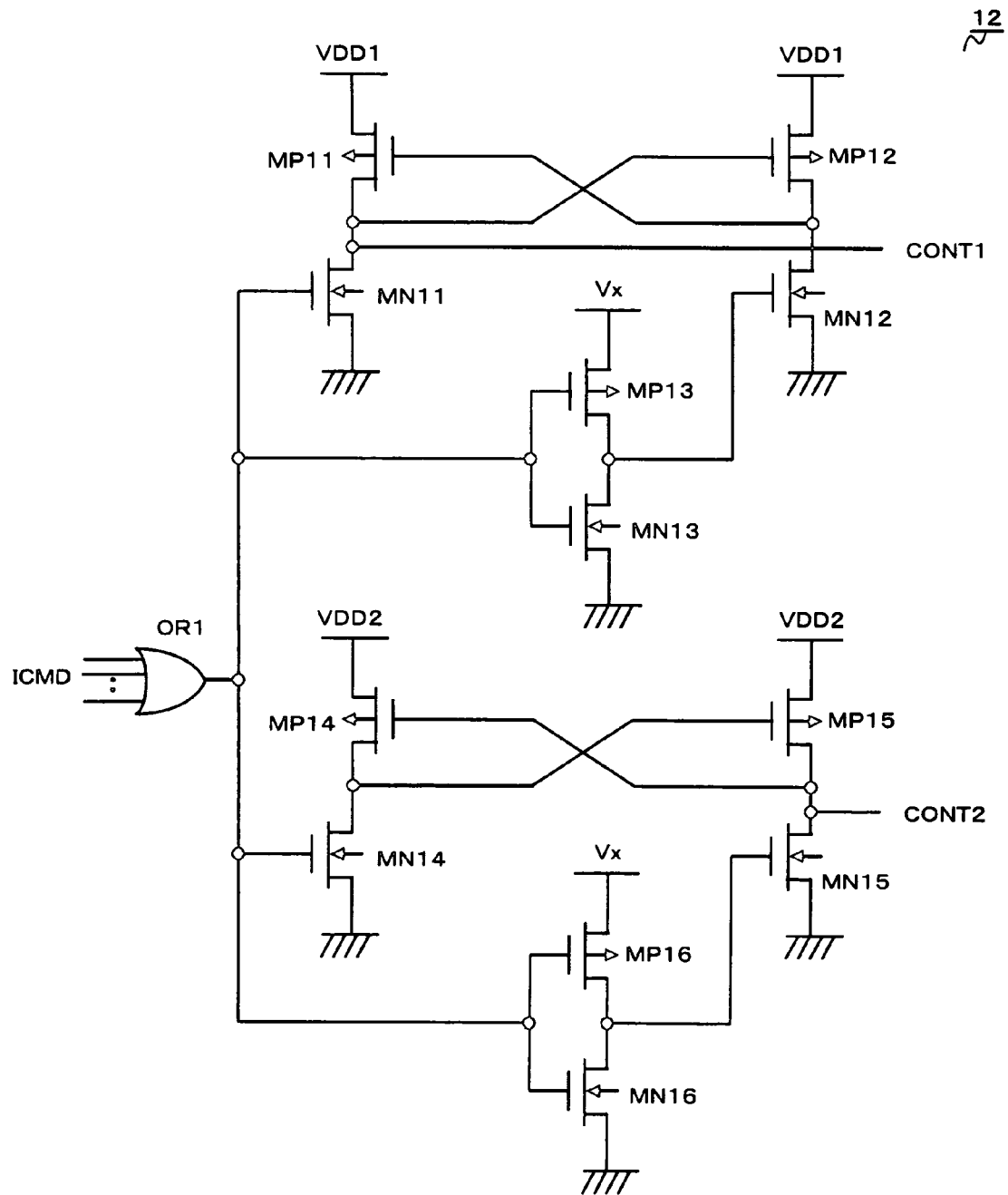
FIG. 2 is a circuit diagram showing a specified instance of a power supply control circuit.

FIG. 2 depicts a circuit diagram showing a specified instance of the power supply control circuit 12. Referring to FIG. 2, the power supply control circuit 12 includes an OR circuit OR1, NMOS transistors MN to MN16 and PMOS transistors MP11 to MP16. The PMOS transistors MP11 and MP12 have their gates and drains cross-coupled to each other, while having their sources connected to the power supply VDD1. The NMOS transistor MN has its drain connected to a drain of the PMOS transistor MP11 to output the control signal CONT1. The NMOS transistor MN11 also has its gate connected to an output of the OR circuit OR1, while having its source grounded. The NMOS transistor MN12 has its drain connected to a drain of the PMOS transistor MP12, while having its gate connected to an output of the OR circuit OR1 via an inverter circuit made up of an NMOS transistor MN13 and a PMOS transistor MP13. The source of the NMOS transistor MN12 is grounded.

The NMOS transistors MN14 to MN16 and the PMOS transistors MP14 to MP16 are connected in similar manner to the NMOS transistors MN11 to MN13 and the PMOS transistors MP11 to MP13, respectively. However, the PMOS transistors MP14 and MP15 have their sources connected to the power supply VDD2. The OR circuit OR1 takes a logical sum of the multiple internal command signals ICMD to output the resulting logical sum.

With the above configuration of the power supply control circuit 12, the output of the OR circuit OR1 becomes "H" in level as a result of activation of one of the preset internal command signals ICMD. Hence, the NMOS transistor MN11 is turned on, so that the control signal CONT1 becomes "L" in level. Also, the NMOS transistor MN14 is turned on to turn on the PMOS transistor MP15 so that the control signal CONT2 becomes "H" in level. Among the instances of the internal command signals ICMD, there is an ACT signal, that is, a signal designating a row address of a DRAM. The "H" level of this ACT signal is to be its activated state.

When the internal command signals ICMD are inactivated, with the ACT signal being "L" in level, the output of the OR circuit OR1 becomes "L" in level. Hence, the PMOS transistor MP13, NMOS transistor MN12 and the PMOS transistor MP11 are turned on, while the NMOS transistor MN11 is turned off, with the control signal CONT1 becoming "H" in level. On the other hand, the PMOS transistor MP16 and the NMOS transistor MN15 are turned on, with the control signal CONT2 becoming "L" in level. The control signal CONT1 is a signal having VDD1 as its amplitude, while the control signal CONT2 is a signal having VDD2 as its amplitude.

Figure 3:
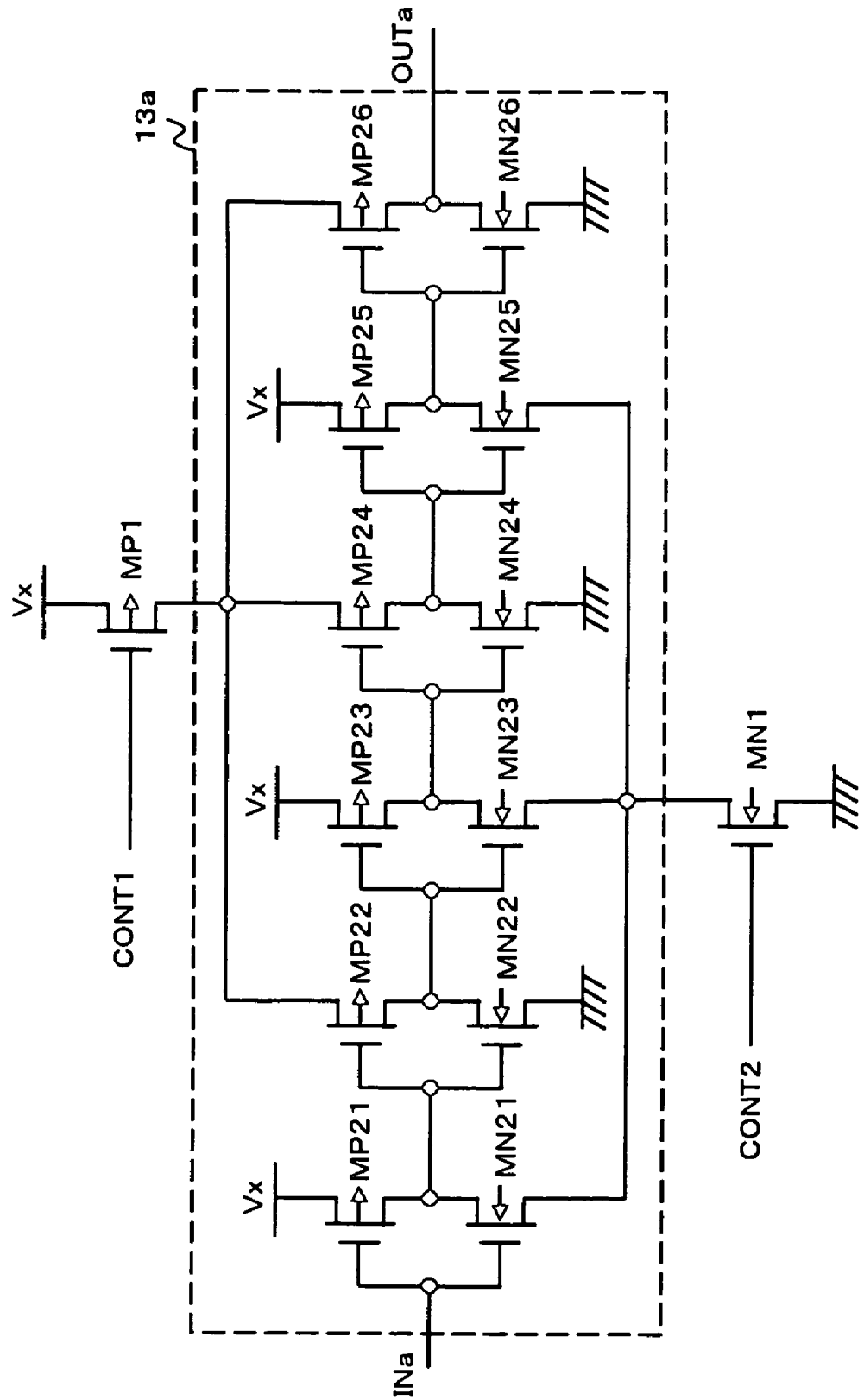
FIG. 3 is a circuit diagram showing a specified instance of a functional circuit.

FIG. 3 depicts a circuit diagram showing a specified instance of the functional circuit. Referring to FIG. 3, the functional circuit 13a includes NMOS transistors MN21 to MN26 and PMOS transistors MP21 to MP26. The NMOS transistor MN21 and the PMOS transistors MP21 are connected in series with each other to form an inverter circuit, and the NMOS transistor MN22 and the PMOS transistors MP22 are similarly connected in series with each other to form an inverter circuit and so forth up to the NMOS transistor MN26 and the PMOS transistors MP26 which are likewise connected in series with each other to form an inverter circuit. The functional circuit 13a thus forms a delay circuit which delays the input signal INa to deliver the delayed signal as output signal OUTa. It should be noted that the sources of the NMOS transistors MN21, MN23 and MN25 are grounded via the NMOS transistor MN1, while the sources of the NMOS transistors MN22, MN24 and MN26 are grounded directly. The sources of the PMOS transistors MP22, MP24 and MP26 are connected to Vx via the PMOS transistor MP1, while the sources of the PMOS transistors MP21, MP23 and MP25 are directly connected to Vx.

Meanwhile, the functional circuit 13a may be other than the delay circuit. The other circuit may be exemplified by a row decoder that decodes a row address or a sense amplifier enabling circuit that activates a sense amplifier circuit configured for amplifying data from a memory cell designated by a row address.

Figure 4:
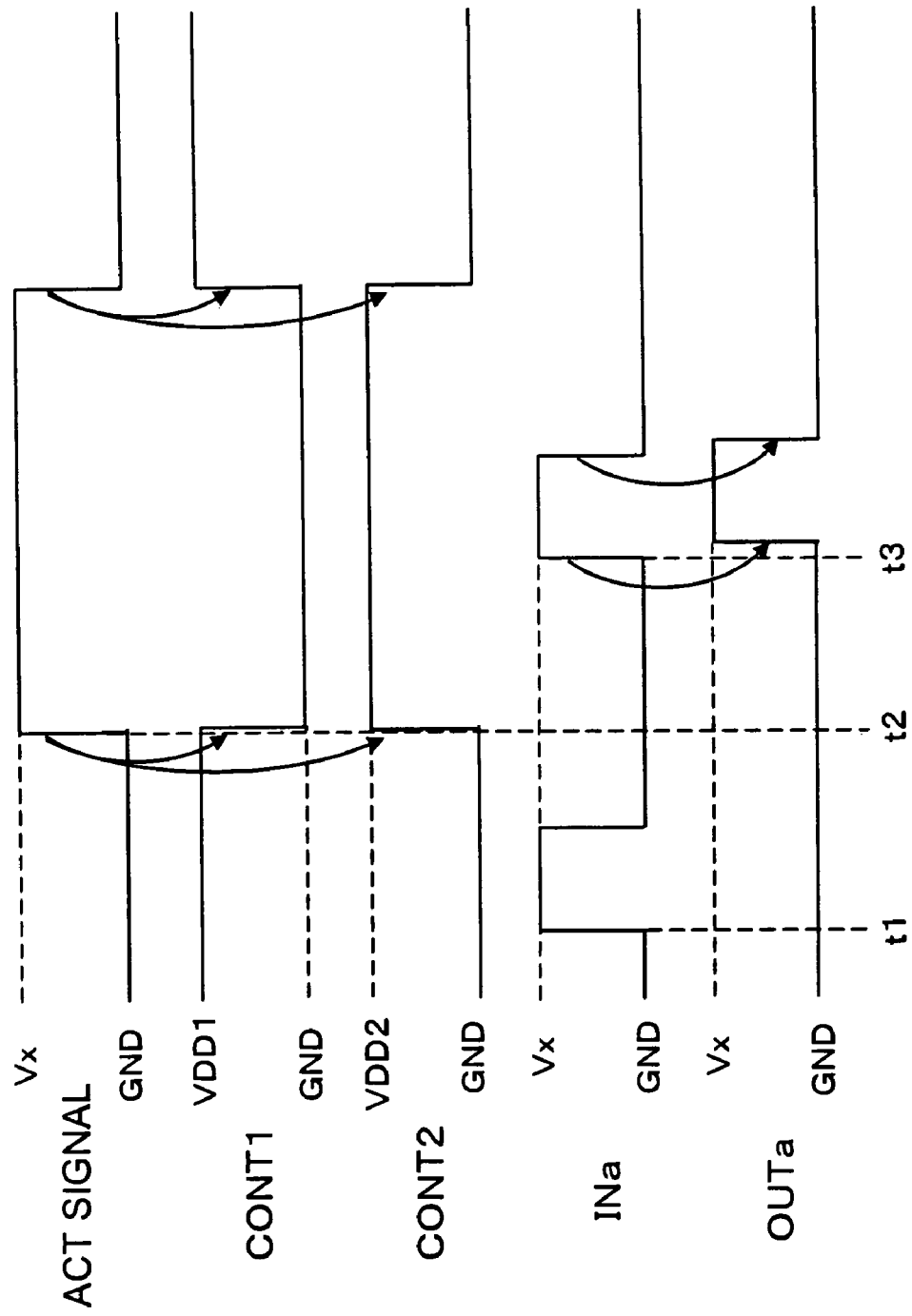
FIG. 4 is a timing chart showing waveforms of various sections of the semiconductor device related with Example 1 of the present invention.

The operation of the circuits shown in FIGS. 1 to 3 will now be described. FIG. 4 depicts a timing chart of each component part of a semiconductor device according to Example 1 of the present invention. If the ACT signal, one of the internal command signals ICMD, is at an "L" level (GND level), and the other internal command signals ICMD (see FIG. 2) are also at an "L" level, the state of the DRAM is such that it waits for access from outside. At this time, the control signal CONT1 is at an "H" level (VDD1 level), and the control signal CONT2 is at an "L" level (GND level). Hence, the PMOS transistors MP1, MP2 and the NMOS transistors MN1, MN2 of FIG. 1 are in non-conducting states, such that, if the input signal INa transitions from the level "L" to the level "H" at a timing t1, such state is not reflected in the output signal OUTa. That is, the outstanding state is a standby state in which the functional circuit 13a is not in operation. Since the VDD1 (1.8V) is applied to the gates of the PMOS transistors MP1, MP2, it is possible to suppress the sub-threshold leakage of the PMOS transistor MP1 to a lesser value than if the VDD2 (1.2V) is applied.

If next the ACT signal becomes "H" in level at a timing t2, the PMOS transistors MP1, MP2 and the NMOS transistors MN1, MN2 are all in conducting states. Hence, the functional circuit 13a is in operation, such that, when the input signal INa transitions from the "L" level to the "H" level at a timing t3, the output signal OUTa transitions from the "L" level to the "H" level in response thereto. It should be noted that voltage VDD2 (1.2V) is here supplied to the gates of the NMOS transistors MN1, MN2. The reason the voltage VDD2 is so supplied is that, if the voltage VDD1 (1.8V) is supplied, the voltages Vgs of the NMOS transistors become larger (1.8V), thus possibly breaking down the transistors' gate oxide films.

As set out above, the signal of an amplitude equal to the potential level of the voltage VDD1 is supplied to the gates of the PMOS transistors MP1 and MP2, while the signal of an amplitude equal to the potential level of the voltage VDD2 is supplied to the gates of the NMOS transistors MN1, MN2. By so doing, it becomes possible to prevent breakage of the gate oxide films as the sub-threshold leakage is reduced.

Figure 5:
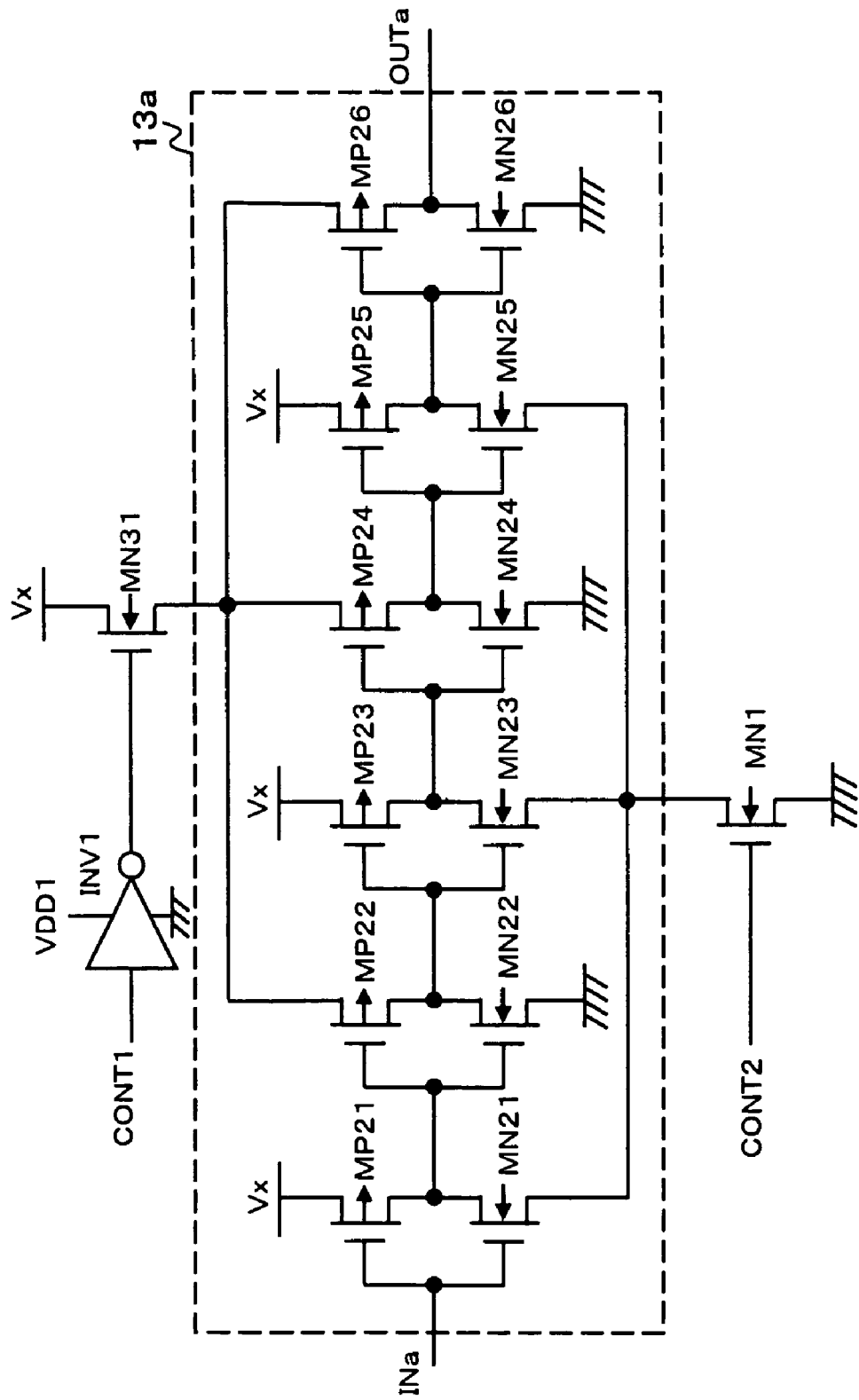
FIG. 5 is a circuit diagram for illustrating another driving mode of the functional circuit.

FIG. 5 depicts a circuit diagram showing another method for driving a functional circuit. In FIG. 5, reference symbols which are the same as those used in FIG. 3 denote the same components, and hence the components are not described. An NMOS transistor MN31 is used in place of the PMOS transistor MP1 of FIG. 3. The control signal CONT1 is inverted in logic state by an inverter circuit INV1 and the so inverted signal is delivered to the gate of the NMOS transistor MN31. If, in such configuration, the internal voltage Vx=1.2V and the threshold voltage of the NMOS transistor Vt=0.3V, it is possible to deliver Vx to the functional circuit 13a without voltage drop substantially under the condition of VDD1>1.5V. If, in such case, the current characteristics of the PMOS and NMOS transistors are taken into consideration, the NMOS transistor is smaller in area than the PMOS transistor and hence the chip area may now be reduced.

Figure 6:
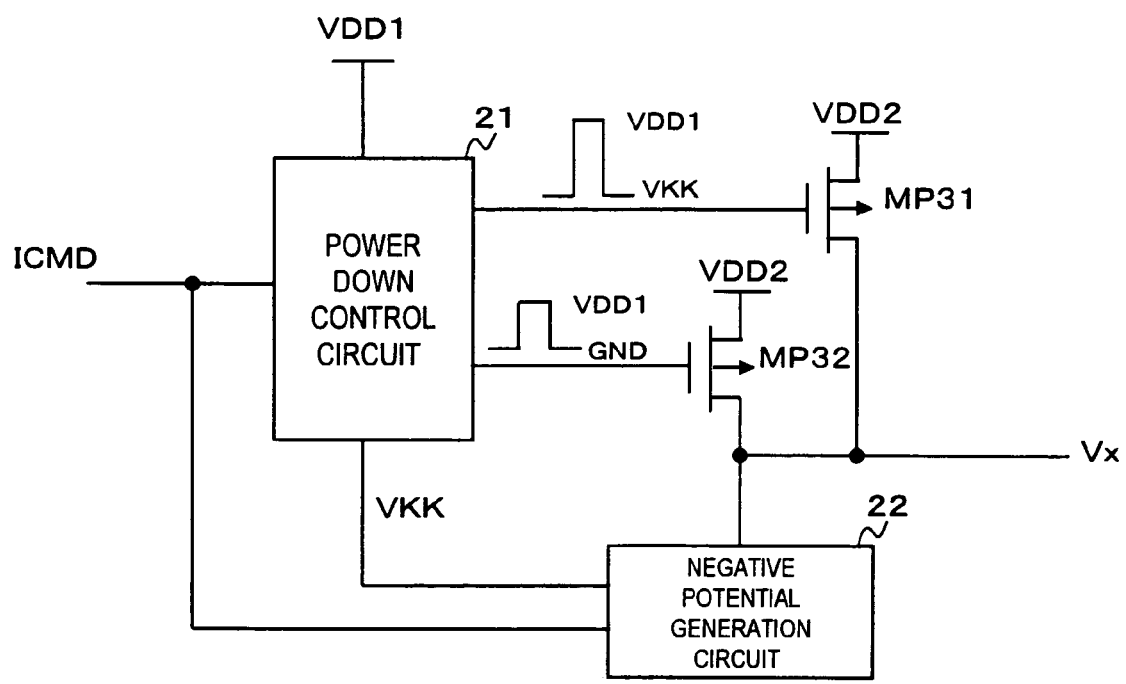
FIG. 6 is a circuit diagram showing a circuit for generating an internal voltage Vx.

FIG. 6 depicts a circuit diagram showing a circuit for generating the internal voltage Vx. The circuit for generating the internal voltage Vx includes a power down control circuit 21, a negative potential generation circuit 22 and PMOS transistors MP31, MP32. The power down control circuit 21 inputs the internal command signal ICMD, the power supply voltage VDD1 and a negative voltage VKK, and delivers a control signal of an amplitude between VDD1 and VKK to the gate of the PMOS transistor MP31. The power down control circuit also delivers a control signal of an amplitude between VDD1 and GND to the gate of the PMOS transistor MP32. The PMOS transistors MP31, MP32 exercises control as to whether or not the voltage VDD2 is to be output as Vx. The negative potential generation circuit 22 is formed e.g., by a charge pump, and generates a negative voltage VKK from Vx.

If, in the Vx generation circuit, having the above mentioned configuration, the internal command signal ICMD indicates power-down (deep power-down), the negative potential generation circuit 22 is not in operation, such that Vx is not generated by the power down control circuit 21. That is, the potential of VDD1 is supplied to the gate electrodes of both the PMOS transistors MP31 and MP32.

If the internal command signal ICMD indicates a power state other than the power-down (deep power-down), the negative potential generation circuit 22 is in operation, and the power down control circuit 21 exercises control of generating Vx. That is, the gate potentials of the PMOS transistors MP31, MP32 become equal to VKK and GND, respectively. The gate potential of the PMOS transistor MP31 is set so as to be equal to VKK in order to enlarge the gate-to-source voltage Vgs of the PMOS transistor MP31 to increase the voltage generation capability of the PMOS transistor MP31. It should be noted that the on-current of the PMOS transistor MP31 becomes larger than that in case its gate is at GND.

It is noted that, when the power supply of a DRAM is turned on, such as at the time of restoration from power down, it may sometimes occur that the voltage Vx fails to reach a preset potential. In addition, since Vx is used in the negative potential generation circuit 22, VKK may not be generated when Vx is not delivered. In this consideration, the voltage Vx is generated by the PMOS transistor MP32 whose gate is supplied with GND. The voltage Vx generated is delivered to the negative potential generation circuit 22. In this configuration, VKK may be generated quickly on power up of the DRAM. Since it is basically sufficient that the PMOS transistor MP32 is able to deliver Vx to the negative potential generation circuit 22, the size of the PMOS transistor MP32 smaller than that of the PMOS transistor MP31 may do well.

Moreover, in FIG. 6, the voltage Vx, not generated in the power-down state, is used as a power supply by the negative potential generation circuit 22. It is thus possible to reduce current consumption in the power-down state of the negative potential generation circuit 22 in comparison with the case of using VDD1 or VDD2 as the power supply.

Figure 7:
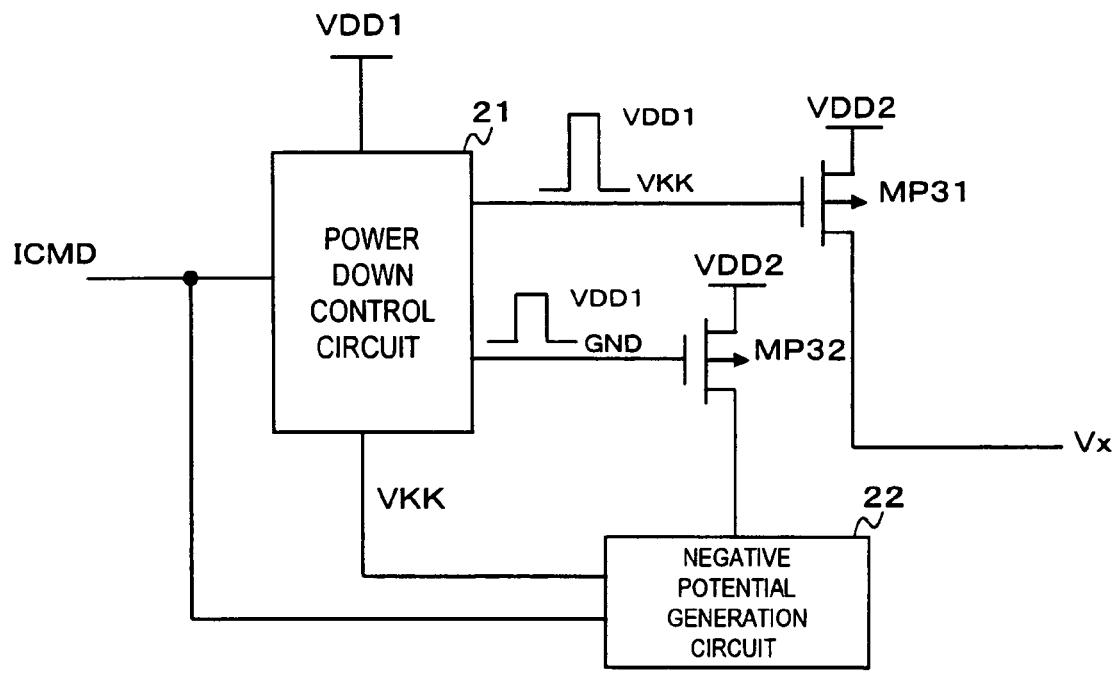
FIG. 7 is a circuit diagram showing another circuit for generating the internal voltage Vx.

In FIG. 6, the drains of the PMOS transistors MP31, MP32 are connected together. These may, however, be separated from each other, as shown in FIG. 7. In the circuit of FIG. 7, in which the PMOS transistor MP31 delivers only Vx for the negative potential generation circuit 22 to the negative potential generation circuit 22, the load capacitance may be reduced to a smaller value. It is thus possible to provide for quick rise of Vx delivered to the negative potential generation circuit 22.

The disclosure of the aforementioned Patent Document is incorporated by reference herein. The particular exemplary embodiments or examples may be modified or adjusted within the gamut of the entire disclosure of the present invention, inclusive of claims, based on the fundamental technical concept of the invention. In addition, variegated combinations or selections of the elements disclosed herein may be made within the framework of the claims. That is, the present invention may encompass various modifications or corrections that may occur to those skilled in the art within the gamut of the entire disclosure of the present invention inclusive of claim and the technical concept of the present invention.

What is claimed is:

1. A semiconductor device comprising:
a functional circuit;
a first transistor that exercises control as to whether or not a first power supply potential is to be delivered to said functional circuit;
a second transistor that exercises control as to whether or not a second power supply potential is to be delivered to said functional circuit;
a first external terminal supplied with a third power supply potential;
a second external terminal supplied with a fourth power supply potential greater than said third power supply potential;
a third external terminal supplied with the second power supply potential; and
a power supply control circuit that delivers a first control signal having a first amplitude to said first transistor to control an electrically conducting state or an electrically non-conducting state of said first transistor, said power supply control circuit delivering a second control signal having said third power supply potential as a second amplitude to said second transistor to control an electrically conducting state or an electrically non-conducting state of said second transistor,
said first amplitude being defined as a potential difference between the second and fourth power supply potentials, and said second amplitude being defined as a potential difference between the second and third power supply potentials,
said functional circuit being in an operation state or in a standby state when said first and second transistors are in the electrically conducting state or in the electrically non-conducting state, respectively.

2. The semiconductor device according to claim 1, wherein said power supply control circuit controls the electrically conducting state or the electrically non-conducting state of said first and second transistors based on a command signal entered from outside.

3. The semiconductor device according to claim 1, wherein said first transistor comprises a PMOS (p-type metal-oxide semiconductor) transistor, said second transistor comprising an NMOS (n-type metal-oxide semiconductor) transistor, said first and second control signals being supplied in reverse logic levels relative to one another.

4. The semiconductor device according to claim 1, wherein said first and second transistors comprise NMOS transistors, said first and second control signals being supplied in the a same logic level.

5. A semiconductor device comprising:
a functional circuit;
a first transistor that exercises control as to whether or not a first power supply potential is to be delivered to said functional circuit;
a second transistor that exercises control as to whether or not a second power supply potential is to be delivered to said functional circuit;
a first external terminal supplied with a third power supply potential;
a second external terminal supplied with a fourth power supply potential greater than said third power supply potential;
a power supply control circuit that delivers a first control signal, having said fourth power supply potential as an amplitude, to said first transistor to control an electrically conducting state or an electrically non-conducting state of said first transistor, said power supply control circuit delivering a second control signal, having said third power supply potential as an amplitude, to said second transistor to control an electrically conducting state or an electrically non-conducting state of said second transistor,
said functional circuit being in an operation state or in a standby state when said first and second transistors are in the electrically conducting state or in the electrically non-conducting state, respectively ;
third and fourth transistors that exercise control as to whether or not said third power supply potential is to be supplied as said first power supply potential;
a power down control circuit that delivers a third control signal, having an amplitude between said fourth power supply potential and a negative potential, to said third transistor to control an electrically conducting state or an electrically non-conducting state of said third transistor, said power down control circuit delivering a fourth control signal, having said fourth power supply potential as an amplitude, to said fourth transistor to control an electrically conducting state or an electrically non-conducting state of said fourth transistor; and a negative potential generation circuit that generates said negative potential based on said first power supply potential to deliver said negative potential generated to said power down control circuit.

6. The semiconductor device according to claim 5, wherein said fourth transistor is controlled to deliver said third power supply potential only to said negative potential generation circuit, said negative potential generation circuit operating by said first power supply potential delivered by said fourth transistor.

7. The semiconductor device according to claim 5, wherein said power down control circuit controls the electrically conducting state and the electrically non-conducting state of said third and fourth transistors based on a command signal entered from outside.

8. A semiconductor device comprising:
a circuit;
a first terminal supplied with a first voltage;
a second terminal;
a first transistor provided between the first terminal and the circuit, the first transistor being turned on or off in response to a first control signal;
a second transistor provided between the second terminal and the circuit, the second transistor being turned on or off in response to a second control signal, the second control signal being different in voltage amplitude from the first control signal;
a voltage generating circuit generating a second voltage at an output node thereof when a command signal is activated, and stopping generation of the second voltage at the output node when the command signal is inactivated, the second terminal being coupled to the output node of the voltage generating circuit; and
a control circuit coupled to a first external terminal supplied with a third voltage, a second external terminal supplied with a fourth voltage greater than the second voltage, and a third external terminal supplied with the first voltage, and the control circuit generating the first control signal having a first amplitude and the second control signal having a second amplitude, the first amplitude being defined as a voltage difference between the first and fourth voltages, and the second amplitude being defined as a voltage difference between the first and third voltages.

9. The semiconductor device as claimed in claim 8, wherein the command signal is inactivated during a power down state and the command signal is activated during an operation state or a standby state.

10. A semiconductor device comprising:
a circuit;
a first terminal supplied with a first voltage;
a second terminal;
a first transistor provided between the first terminal and the circuit, the first transistor being turned on or off in response to a first control signal;
a second transistor provided between the second terminal and the circuit, the second transistor being turned on or off in response to a second control signal, the second control signal being different in voltage amplitude from the first control signal; and
a voltage generating circuit generating a second voltage at an output node thereof when a command signal is activated, and stopping generation of the second voltage at the output node when the command signal is inactivated, the second terminal being coupled to the output node of the voltage generating circuit to receive the second voltage, the first and second transistors being turned on at substantially the same time, respectively, and then turned off at substantially the same time, respectively,
wherein a voltage amplitude of the first control signal is defined as a voltage difference between the first and second voltages and a voltage amplitude of the second control signal is defined as a voltage difference between the first voltage and a third voltage greater than the second voltage.

11. The semiconductor device according to claim 10, wherein the first transistor includes an N-type transistor and the second transistor includes a P-type transistor.

12. The semiconductor device according to claim 10, wherein the first and second transistors include N-type transistors, respectively.

13. A semiconductor device comprising:
a circuit;
a first terminal supplied with a first voltage;
a second terminal;
a first transistor provided between the first terminal and the circuit, the first transistor being turned on or off in response to a first control signal;
a second transistor provided between the second terminal and the circuit, the second transistor being turned on or off in response to a second control signal, the second control signal being different in voltage amplitude from the first control signal; and
a voltage generating circuit generating a second voltage at an output node thereof when a command signal is activated, and stopping generation of the second voltage at the output node when the command signal is inactivated, the second terminal being coupled to the output node of the voltage generating circuit to receive the second voltage, the first and second transistors being turned on at substantially the same time, respectively, and then turned off at substantially the same time, respectively,
wherein the voltage generating circuit includes a third transistor provided between the output node and a third terminal supplied with the second voltage, the third transistor receiving a third control signal at a gate thereof, and the third control signal being different in voltage amplitude from each of the first and second control signals.

14. The semiconductor device according to claim 13, wherein a voltage amplitude of the third control signal is defined as a voltage difference between the third voltage and a fourth voltage lower than the first voltage.

15. The semiconductor device according to claim 14, wherein the voltage generating circuit further includes a negative potential generation circuit to generate the fourth voltage.

16. A semiconductor device comprising:
a circuit;
a first terminal supplied with a first voltage;
a second terminal;
a first transistor provided between the first terminal and the circuit, the first transistor being turned on or off in response to a first control signal;
a second transistor provided between the second terminal and the circuit, the second transistor being turned on or off in response to a second control signal, the second control signal being different in voltage amplitude from the first control signal; and
a voltage generating circuit generating a second voltage at an output node thereof when a command signal is activated, and stopping generation of the second voltage at the output node when the command signal is inactivated, the second terminal being coupled to the output node of the voltage generating circuit to receive the second voltage, the first and second transistors being turned on at substantially the same time, respectively, and then turned off at substantially the same time, respectively, the first transistor being turned on whenever the second transistor is turned on and the first transistor being turned off whenever the second transistor is turned off, wherein a voltage amplitude of the first control signal is defined as a voltage difference between the first and second voltages and a voltage amplitude of the second control signal is defined as a voltage difference between the first voltage and a third voltage greater than the second voltage.

17. The semiconductor device according to claim 16, wherein the voltage generating circuit includes a third transistor provided between the output node and a third terminal supplied with the second voltage, the third transistor receiving a third control signal at a gate thereof, and the third control signal being different in voltage amplitude from each of the first and second control signals.

* * * * *